(12) United States Patent
Nelson et al.

(10) Patent No.: US 6,278,332 B1
(45) Date of Patent: Aug. 21, 2001

(54) CHARGE PUMP FOR LOW-VOLTAGE, LOW-JITTER PHASE LOCKED LOOPS

(75) Inventors: Dale Harvey Nelson, Shillington; Lizhong Sun, Emmaus, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/504,515

(22) Filed: Feb. 15, 2000

(51) Int. Cl.$^7$ .............................. H03L 7/085; H03L 7/089
(52) U.S. Cl. ................................ 331/17; 331/8; 331/25; 327/156; 327/157; 327/108; 327/111
(58) Field of Search ......................... 331/1 A, 8, 16, 331/17, 18, 25; 326/21, 26, 27; 327/156–159, 108–112; 375/376; 455/260

(56) References Cited

U.S. PATENT DOCUMENTS

| | | | |
|---|---|---|---|
| 5,532,636 | * 7/1996 | Mar et al. | 327/543 |
| 5,809,097 | 9/1998 | Lakshmikumar . | |
| 5,886,551 | 3/1999 | Narahara . | |
| 5,898,336 | 4/1999 | Yamaguchi . | |
| 5,945,855 | * 8/1999 | Momtaz | 327/157 |
| 5,986,485 | 11/1999 | O'Sullivan . | |
| 5,987,085 | 11/1999 | Anderson . | |
| 6,169,458 | * 1/2001 | Shenoy et al. | 331/17 |

OTHER PUBLICATIONS

B. Razavi (ED.), "Monolithic Phase–Locked Loops & Clock Recovery Circuits, Theory & Design," IEEE Press, 1997, pp. 25–28.

Floyde M. Gardner, "Charge–Pump Phase–Lock Loops," IEEE Trans. Comm., vol. COM–28, Nov. 1980, pp. 1849–1858.

Ian A. Young, et al., "A PLL Clock Generator with 5 to 110 Mhz of Lock Range Microprocessors," IEEE Journal of Solid–State Circuits, vol. 27, No. 11, Nov. 1992, pp. 1599–1607.

* cited by examiner

*Primary Examiner*—David Mis
(74) *Attorney, Agent, or Firm*—Duane, Morris & Heckscher LLP

(57) ABSTRACT

An integrated circuit has a phase-locked loop (PLL) frequency synthesizer circuit which has a charge pump circuit for providing an output control voltage to adjust an oscillator frequency in response to fast and slow signals provided by a phase detector. The charge pump circuit has first and second current sources, and a switching network for selectively coupling, in response to said fast signal, the first current source to one of an internal node and an output node coupled to an output capacitor and having an output voltage, and, in response to said slow signal, the second current source to one of the internal node and the output node. The charge pump circuit has first and second unity gain buffers coupled in parallel at their inputs to the output node and at their outputs to the internal node, wherein the first buffer is configured to have a voltage tracking range approximately up to a positive supply rail and the second buffer is configured to have a voltage tracking range approximately down to a negative supply rail, wherein the voltage tracking ranges of said buffers overlap each other, to provide an overall substantially rail-to-rail voltage tracking range.

18 Claims, 3 Drawing Sheets

100

400

500

US 6,278,332 B1

CHARGE PUMP FOR LOW-VOLTAGE, LOW-JITTER PHASE LOCKED LOOPS

BACKGROUND OF THE INVENTION

1. Field of the Invention

The present invention relates to charge pumps used in phase-locked loops (PLLs) and, in particular, to low-voltage charge pumps for use in low-voltage, low-jitter PLLs.

2. Description of the Related Art

Phase-locked loop ("PLL") circuits are widely used in a variety of applications. A PLL typically produces an output signal of substantially the same frequency as a reference signal, with a predetermined phase relation to the reference signal. A PLL can be used wherever it is necessary to synchronize the phase and/or frequency of two signals. For example, a PLL may be used to provide a frequency synthesizer which generates an output signal whose frequency bears a specified relationship to the frequency of an input reference signal. This may be used to generate an output clock signal having an accurate frequency, for example, based on an input clock signal having a known frequency. PLL circuits are often used in other types of signal processing circuits as well, such as AM and FM radios, televisions, wireless communication equipment, and multiplex stereo demodulating circuits. In a typical communications application, for example, a PLL is used to synchronize a local oscillator to the frequency (and/or phase) of an incoming data signal.

In one application, a PLL may be used to tune a high frequency local oscillator to a separate, more stable, lower-frequency local oscillator. For example, a very high frequency signal may be necessary for synchronizing to an incoming radio frequency signal at, for example, 800 MHz. Crystal oscillators are very stable and accurate, but typically do not operate at high enough frequencies to be used directly for high radio frequency applications. Thus, a high frequency voltage-controlled oscillator (VCO) may be utilized, which generates the desired high frequency very precisely, by placing the VCO in a PLL with a crystal oscillator.

A PLL typically comprises a phase and/or frequency comparator (e.g., a phase detector [PD] or sequential-logic, phase/frequency detector [PFD]), which receives and compares an external input or "reference" signal (or a divided version of this signal) to the output "feedback" signal generated by a VCO (or a divided version of this signal). The PD or PFD generates logic "up" (fast, or phase-leading) and "down" (slow, or phase-lagging) signals, to either speed up or slow down the feedback signal. The PLL also typically comprises a "charge pump" for receiving the up and down signals output by the PD or PFD, and a low pass "loop" filter coupled to the output of the charge pump, to provides an analog output control voltage to the VCO. A common form of VCO for use in a PLL is a ring oscillator that employs a series of delay elements to provide the desired frequency range of operation. Thus, a charge pump usually accompanies a PFD, and, along with a loop filter incorporated into or attached to the output of the charge pump, converts the PFD's output logic states into analog signals suitable for controlling the VCO.

Referring now to FIG. 1, there is shown a block diagram illustrating a conventional PLL frequency synthesizer circuit 100. As shown, PLL circuit 100 comprises an initial ÷N unit 101, which receives input clock signal $I^{CLK}$, having an input frequency. Divider unit 101 divides the input clock signal $I_{CLK}$ to provide internal or common denominator reference clock signal $RF_{CLK}$, which has 1/N the frequency of the input clock signal. Phase frequency detector (PFD) 102 receives this reference clock signal $RF_{CLK}$ as well as the feedback clock signal $FB_{CLK}$, which has been produced by dividing the output of VCO 105 by M with divider unit 107. Thus, the output of VCO 105 is nominally M times the frequency of $RF_{CLK}$, or M/N times the frequency of $I_{CLK}$. The output of VCO 105 is divided by P by divider unit 106, to provide an output clock signal $O_{CLK}$ having a frequency which is M/(N·P) times the frequency of $I_{CLK}$.

Typically, the output clock signal and the input clock signal are each multiples of some common, lower frequency. For example, if the input clock $I_{CLK}$ is 10 MHz, and the desired output clock $O_{CLK}$ is 25 MHz, they are both multiples of 5 MHz. Thus, the common-denominator frequency 5 MHz may be used as the comparison frequency for PFD 102. To achieve this, N=2, and, for a VCO producing a nominally 50 MHz output signal, P=2 and M=10, in an embodiment.

Thus, in the PLL, the 10 MHz input clock signal may be divided by 2 to provide a "common denominator" reference signal 5 MHz signal, and the 25 MHz output clock signal may be divided by 5 to provide a feedback signal of nominal frequency 5 MHz, for comparison by the PFD. (Alternatively, the VCO may itself generate a higher frequency, such as 50 MHz, which is divided by 2 to provide the 25 MHz output clock signal, and divided by 10 to provide the 5 MHz feedback signal.) PLLs and lock detection techniques are described in further detail in Floyd Martin Gardner, *Phaselock Techniques,* 2nd ed. (Wiley 1979); Roland E. Best, *Phase-Locked Loops* (McGraw-Hill 1993); C. R. Hogge, "A Self Correcting Clock Recovery Circuit," *Journal of Lightwave Technology,* Vol. LT-3, No. 6 (December 1985), pp. 1312–1314.

PFD 102 forms a difference signal by comparing the signal based on the external input signal (i.e. $RF_{CLK}$) and the signal based on the VCO signal (i.e. $FB_{CLK}$). In one type of PFD, the difference signal consists of UP (fast) and DOWN (slow) pulse signals, which are applied to the charge pump 103. The charge pump generates charge based on the UP or DOWN signals, which charge is integrated by the loop filter 104 to produce a DC control voltage $V_{CONT}$. This DC control voltage controls the output frequency of the VCO. I.e., the charge pump combined with the loop filter converts the timed output logic levels from digital type PDs or PFDs into analog quantities for controlling the VCO.

When the frequency and phase of the signals compared by the PFD are substantially identical, the PLL is said to be in a state of lock (both frequency and phase lock). Because of the closed loop nature of a PLL and the negative feedback employed, the output frequency of the VCO is maintained to closely match the frequency of the reference input signal. A PLL may be used, therefore, to cause the output signal of the VCO to be locked to a stable reference frequency. For this reason, a PLL is often employed to generate an output reference signal, at a desired frequency, that is frequency and phase locked relative to some input reference signal. Charge pumps are further discussed in F. M. Gardner, "Charge-Pump Phase-Lock Loops," *IEEE Trans. Comm.*, vol. COM-28, pp. 1849–1858 (November 1980); and Behzad Razavi, ed., *Monolithic Phase-Locked Loops and Clock Recovery Circuits:* Theory and Design (IEEE Press, 1996): pp. 1–39.

Referring now to FIG. 2, there is shown a block diagram illustrating charge pump sharing in a charge pump and loop filter 200. The digital signals UP, DN from a PFD such as PFD 102 of FIG. 1 switch current sources $I_{UP}$ and $I_{DN}$ onto the output node, thus delivering a charge to move the output control voltage $V_{CONT}$ up or down. Once the loop is locked, the charge pump 103 will only need to deliver extremely narrow output current pulses to the loop filter 104 to correct for voltage drop in the loop filter due to leakage. Even after lock is achieved, however, a charge sharing effect occurs when switches S1 and S2 are switched off and on. During the time when S1 and S2 are off, $I_{UP}$ and $I_{DN}$ pull nodes X and Y to $V_{DD}$ and ground, respectively; this causes charge-sharing between parasitic capacitors Cx and Cp, and Cy and Cp, when S1 and S2 turn on again, respectively. If $V_{CONT}=V_{DD}/2$, $I_{UP}=I_{DN}$, and Cx=Cy, then $V_{CONT}$ is not disturbed (not changed). However, because $V_{CONT}$ determines the VCO frequency, it is generally not equal to $V_{DD}/2$, thus experiencing a jump when S1 and S2 turn on.

After lock is achieved, especially for PLLs in which the output clock has a higher frequency than the input reference clock, this "jumping" can be periodic and can result in periodic timing jitter, i.e. fluctuation of the oscillation frequency of the VCO. This can also result in a suboptimal duty cycle. Phase noise and jitter are inter-related in that they are frequency domain and time domain representations respectively of the same phenomenon. Thus, periodic timing jitter can be caused by the charge-sharing in charge pumps introduced when the PFD signals switch the charge pump current sources to the output node. In addition to fluctuations in control voltage due to charge pump charge-sharing, various forms of jitter can also be introduced due to substrate noise in the circuit or other causes. Jitter generally falls into three categories: cycle-to-cycle, period, and long-term. The change in a clock's output transition from its corresponding position in the previous cycle is called "cycle-to-cycle jitter." Period jitter refers to the maximum change in a clock's output transition from its ideal position. Long-term jitter measures the maximum change in a clock's output transition from its ideal position over many cycles. Jitter can adversely affect the operation of the PLL or systems that use the PLL, and is thus undesirable. For example, jitter may cause intersymbol interference (ISI) or other types of signal distortion in serial data communications. Jitter is described, for example, in the Young, Greason & Wong article referenced above.

Referring now to FIG. 3, there is shown a block diagram illustrating a phase frequency detector 102, charge pump 103, and loop filter 104 of the PLL 100 of FIG. 1 in greater detail. The aforementioned "jump" effect due to charge sharing can be suppressed if nodes X and Y are bootstrapped to the voltage stored on the capacitor by means of a unity gain amplifier or buffer, as shown in FIG. 3, and as described in I. S. Young, J. K. Greason & K. L. Wong, "A PLL Clock Generator with 5 to 110 MHz of Lock Range of Microprocessors," *IEEE J Solid-State Circuits*, vol. 27, pp. 1599–1607 (November 1992). In the charge pump of FIG. 3, when nodes A and B are not switched to $V_{CONT}$, they are switched instead to node AB, which is made approximately equal to $V_{CONT}$ through the action of a buffer (unity-gain operational amplifier (op amp) 311). This suppresses any charge sharing from the parasitic capacitance on nodes A or B that could otherwise introduce timing jitter.

Thus, in order to reduce or eliminate the jitter caused by charge sharing in a charge pump, the buffer utilized must have a sufficient dynamic tracking range to permit it to mimic the output voltage at node AB over a sufficient range. However, as technology moves toward sub-1.5V power supply voltages for submicron standard CMOS processes, conventional op amps such as op amp 311 cannot achieve the low voltage and rail-to-rail operation required. In particular, if op amp 311 is powered by supply rails $V_{DD}=1.5V$ and $V_{SS}$=ground, it cannot provide an output signal range at node AB from rail-to-rail. As described below, this can impair the function of the PLL. For example, if the op amp employed for buffer 311 can only provide a 0.7V tracking range, given a supply voltage $V_{DD}=1.5V$, then it may be unable to suppress charge sharing over the entire range of possible control voltage magnitudes. It is, therefore, desirable to provide for improved suppression of charge sharing in charge pumps, given lower supply voltages.

SUMMARY

An integrated circuit has a phase-locked loop (PLL) frequency synthesizer circuit which has a charge pump circuit for providing an output control voltage to adjust an oscillator frequency in response to fast and slow signals provided by a phase detector. The charge pump circuit has first and second current sources, and a switching network for selectively coupling, in response to said fast signal, the first current source to one of an internal node and an output node coupled to an output capacitor and having an output voltage, and, in response to said slow signal, the second current source to one of the internal node and the output node. The charge pump circuit has first and second unity gain buffers coupled in parallel at their inputs to the output node and at their outputs to the internal node, wherein the first buffer is configured to have a voltage tracking range approximately up to a positive supply rail and the second buffer is configured to have a voltage tracking range approximately down to a negative supply rail, wherein the voltage tracking ranges of said buffers overlap each other, to provide an overall substantially rail-to-rail voltage tracking range.

DESCRIPTION OF THE PREFERRED EMBODIMENT

Figure 3:
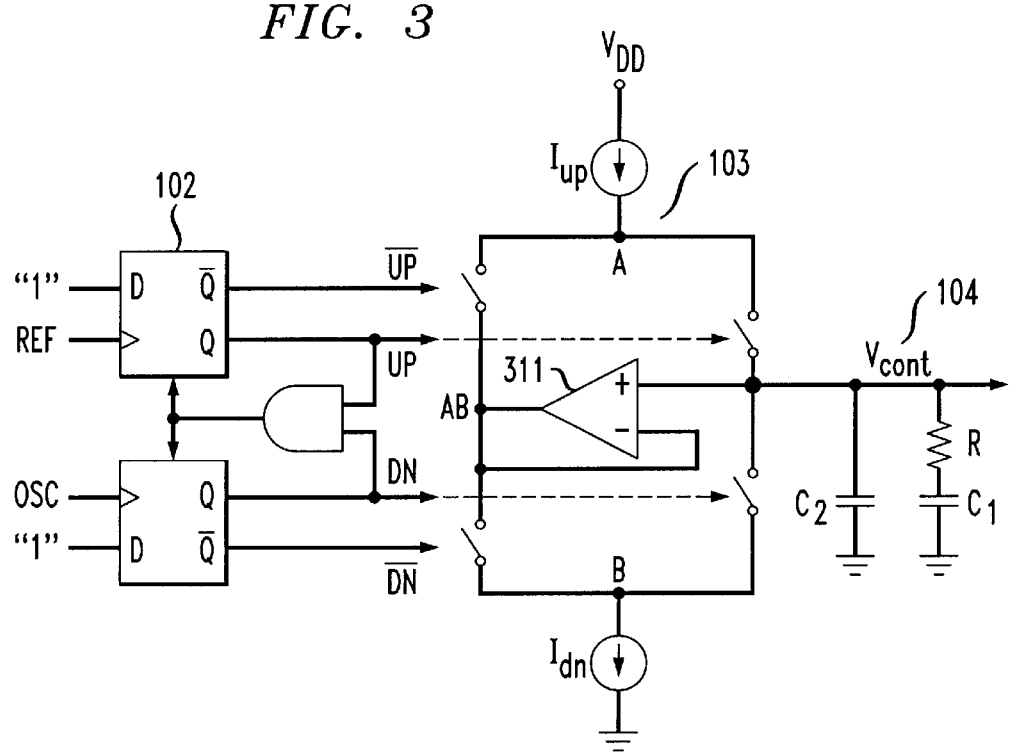
FIG. 3 is a block diagram illustrating the phase frequency detector, charge pump, and loop filter of the PLL of FIG. 1 in greater detail.

The present invention provides a charge pump which can operate at low voltage with charge sharing suppression and near rail-to-rail output voltage swing for VCO input. This advantageously helps to reduce VCO timing jitter. Instead of using a single buffer, as in charge pump 103 of FIG. 3, with its inability to achieve low voltage, substantially rail-to-rail operation, the present invention employs parallel buffers, one capable of providing a signal range approximately up to one of the supply rails, and the other capable of providing a signal range approximately as far down as the other supply rail, so that, together, these parallel buffers provide nearly full rail-to-rail operation even with a low power supply. In one embodiment, each buffer comprises two cascaded source followers, i.e. a single-ended two-stage level shifter. In another embodiment, one of the buffers comprises an n-channel differential pair, and the other comprises a p-channel differential pair. These and other features and advantages of the present invention are described in further detail below.

Figure 1:
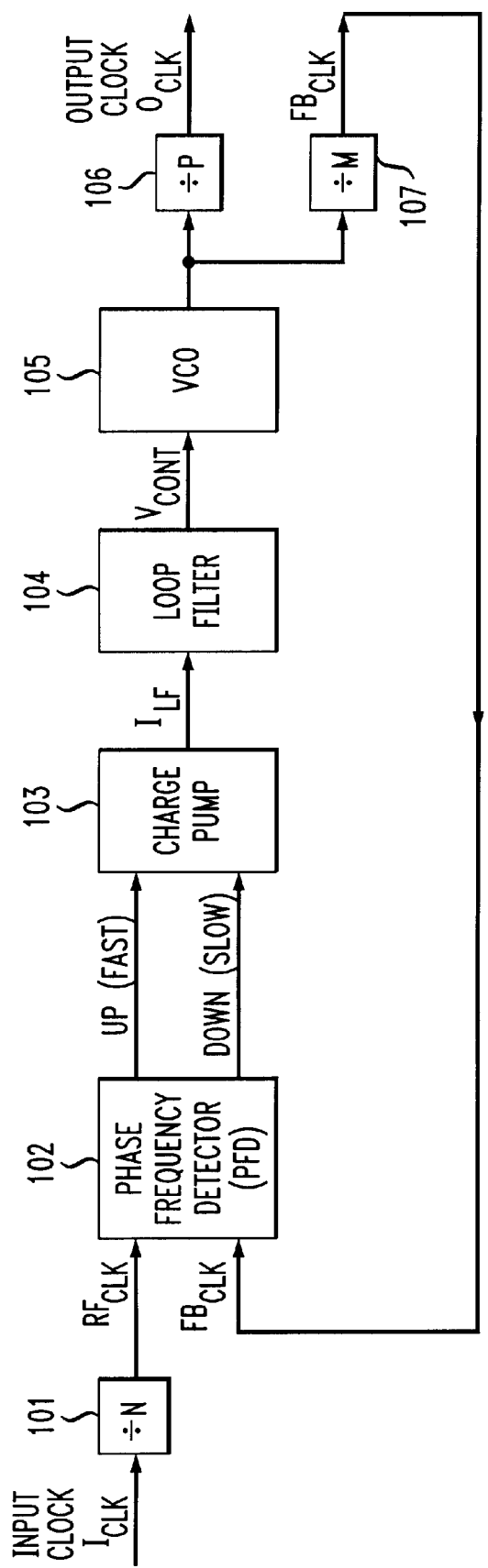
FIG. 1 is a block diagram illustrating a conventional phase-locked loop frequency synthesizer circuit (PLL)
Figure 2:
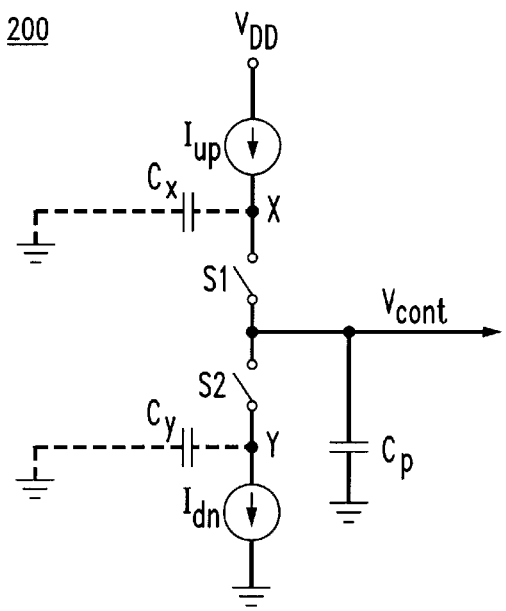
FIG. 2 is a block diagram illustrating charge sharing in a charge pump and loop filter.
Figure 4:
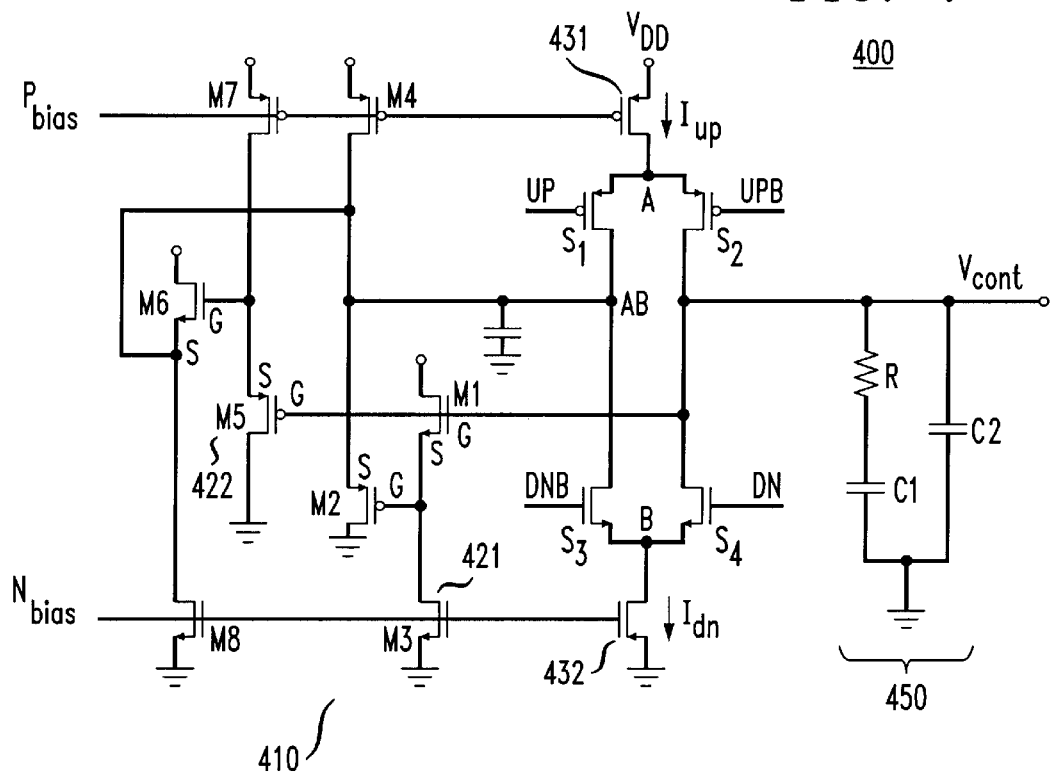
FIG. 4 is a block diagram illustrating an improved charge pump, in accordance with an embodiment of the present invention.

Referring now to FIG. 4, there is shown a block diagram illustrating an improved charge pump circuit 400, in accordance with an embodiment of the present invention. Charge pump circuit 400 comprises a charge pump section 410 and a loop filter section 450. The charge pump 410 delivers output current pulses to the loop filter portion 450, to generate an output control voltage $V_{CONT}$. These two sections 410, 450 together may be considered to be an overall charge pump circuit 400 which provides an output control voltage $V_{CONT}$ for controlling the output frequency of the VCO of the PLL of which the charge pump circuit 400 is a part. In an embodiment, for example, charge pump circuit 400 may be used in place of elements 103, 104 of PLL circuit 100 of FIG. 1.

Charge pump 410 comprises a "bootstrapping" circuit for driving internal node AB with the same voltage present at the output node, i.e. $V_{CONT}$. This bootstrapping circuit consists of two unity gain amplifiers or buffers 421, 422 connected in parallel to drive node AB. These two buffers serve as an overall buffer which makes node AB approximately equal to $V_{CONT}$. As will be appreciated, by equalizing node AB to $V_{CONT}$, the buffer formed by parallel buffers 421, 422 suppresses any charge sharing from the parasitic capacitance on nodes A or B that could otherwise give rise to timing jitter. Charge pump 410 also comprises a switching network comprising switches S1, S2, S3, S4, coupled variously between the two currents sources $I_{UP}$ and $I_{DN}$ and the output node or the internal node, for selectively coupling each current source either to the output node or the internal node in response to the up and down signals UP, DN (and their complements UPB, DNB) received from a PFD such as PFD 102 of FIG. 1.

As will be appreciated, each of buffers 421, 422 is a single-ended, two-stage level shifter, i.e. two cascaded source followers. One of these is an NMOS-PMOS pair, the other is a PMOS-NMOS pair. The buffer 421 consists of transistors M1, M2, M3, and M4. Buffer 421 is a single-ended, two-stage level shifter, comprising two source-followers in cascade, to-wit: n-channel (NMOS) source-follower transistor M1 (used as an input transistor), followed by p-channel (PMOS) source-follower transistor M2 (used as an output transistor). Transistors M3 and M4 are current sources which provide biasing currents for source-follower transistors M1, M2, respectively. The dynamic range of buffer 421 is from $(V_{GS}+V_{SAT})$ to $V_{DD}$, where $V_{GS}$ is the gate-to-source terminal voltage drop of transistors M1, and $V_{SAT}$ is the saturation voltage of transistor M3. By appropriately selecting the transistor size (M1, M2), and biasing current value (M3, M4), the gate-to-source voltage drop $V_{GSN}$ (for NMOS transistors, e.g. M1) and $V_{GSP}$ (for PMOS transistors, e.g. M2) can be matched, to prevent there from being an offset from $V_{CONT}$ and $V_{AB}$.

The second buffer 422 is used for compensating the dynamic range of the first buffer (and vice-versa). As will be appreciated, their dynamic ranges must at least overlap, i.e. each must be from at least a half-way point of the dynamic or tracking range and the respective rail. Buffer 422 consists of transistors M5, M6, M7, and M8. In buffer 422, PMOS source-follower transistor M5 (the input transistor) is cascaded with NMOS source-follower transistor M6 (the output transistor). Transistors M7 and M8 are current sources which provide biasing currents for source-follower transistors M5, M6, respectively. The dynamic range of the second buffer 422 is from $V_{SS}$ (i.e., ground=0) to $(V_{DD}-V_{GS}-V_{SAT})$.

When $V_{AB}$ approaches ground (in particular, when it nears $(V_{GS}+V_{SAT})$), transistors M1, M3, and thus M2, of buffer 421 shut down; but at this point buffer 422 continues to drive $V_{AB}$ as far down as near-ground. On the other hand, when $V_{AB}$ approaches $V_{DD}$ (in particular, when it nears $(V_{DD}-V_{GS}-V_{SAT})$), transistors M5, M7, and thus M6 of buffer 422 shut down.

In the region where both buffers 421, 422 are active, the output $V_{AB}$ is:

$$V_{AB}=V_{CONT}-V_{GS(M1)}+V_{GS(M2)} \qquad (1)$$

$$=V_{CONT}-V_{GS(M6)}+V_{GS(M5)} \qquad (2)$$

With proper bias and transistor size selection, $V_{GS(M1)} \approx V_{GS(M6)}$ and $V_{GS(M2)} \approx V_{GS(M5)}$, so that:

$$V_{AB}=V_{CONT} \qquad (3)$$

with no offset.

Thus, the tracking range of the combination of the two parallel buffers 421, 422 is nearly rail-to-rail. Each respective buffer may be slightly off of the actual rail by a small amount, e.g. 0.1V, due to practical circuit implementations. Thus each provides a range from at least half the dynamic range to approximately or near the respective rail. For example, where $V_{DD}=1.5V$, $V_{SS}=0V$, $(V_{GS}+V_{SAT})$ may be approximately 0.6. Buffer 421 would thus provide a range of approximately 0.6V to 1.4V, while buffer 422 would provide a range of 0.9V to 0.1V. Each buffer's dynamic range thus extends from at least the midway point (0.75V) to near its respective rail, and thus overlap each other by some amount, i.e. 0.3V. In this implementation, the combined buffer would have a dynamic or tracking range of 1.3V, sufficient to track $V_{CONT}$ and thus reduce charge-sharing induced jitter.

Figure 5:
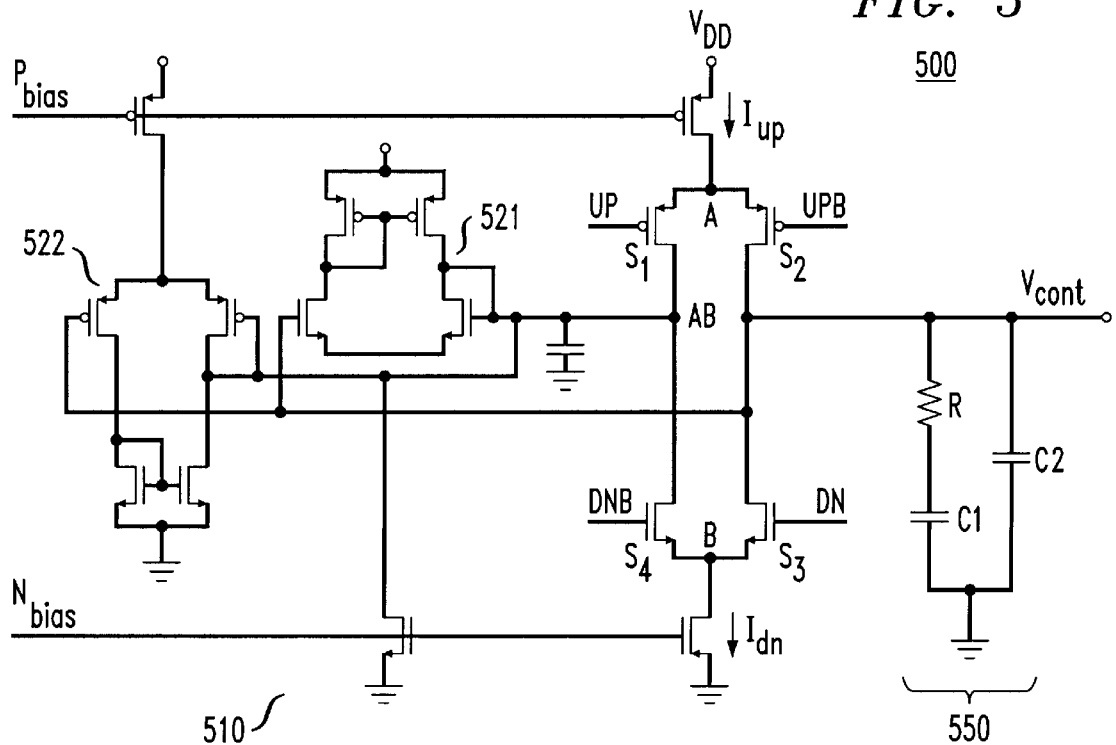
FIG. 5 is a block diagram illustrating an alternative embodiment of an improved charge pump, in accordance with the present invention.

Referring now to FIG. 5 there is shown an alternative embodiment of an improved charge pump 500, in accordance with the present invention. Instead of using a single-ended two-stage level-shifter to implement each buffer, as is done in charge pump circuit 400, complementary differential circuits are used to provide the two parallel buffers 521, 522 that form the overall buffer with substantially rail-to-rail voltage tracking range.

The first buffer 521 consists of a differential pair of NMOS input transistors which have a dynamic tracking range from ($V_{GS}+V_{SAT}$) to $V_{DD}$. Second buffer 522 consists of a differential pair of PMOS input transistors, which have a dynamic tracking range from 0 to ($V_{DD}-V_{GS}-V_{SAT}$). As will be appreciated, the voltage tracking range of the combination of two unity-gain amplifiers or buffers 521, 522, is also approximately rail-to rail, as in circuit 400 of FIG. 4. One advantage of this embodiment is that the input transistors of a given pair are of the same type (i.e., both NMOS or both PMOS) and thus may be easier to match, thus avoiding introducing a DC offset between $V_{CONT}$ and $V_{AB}$.

The present invention therefore provides for low voltage operation (e.g., it can operate at 0.8V for 0.16 μm CMOS process), near rail-to-rail output swing, and good suppression of the charge sharing effect and jitter otherwise caused by this charge sharing.

Some or all of the components of the charge pump and loop filter of the present invention may be fabricated as an integrated circuit (IC), within a semiconductor chip. Chips are formed in the substrate of a physical wafer, e.g. a silicon wafer. Typically, several chips are formed in each wafer. A wafer is a very thin, flat disc of a given diameter. The manufacturing process consists of operations on the surface and substrate of the wafer to create a number of chips. Once the wafer is completely processed, it is cut up into the individual chips.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit comprising a charge pump circuit for providing an output control voltage to adjust an oscillator frequency in response to fast and slow signals, the charge pump circuit comprising:
    (a) first and second current sources;
    (b) a switching network for selectively coupling, in response to said fast signal, the first current source to one of an internal node and an output node coupled to an output capacitor and having an output voltage, and, in response to said slow signal, the second current source to one of the internal node and the output node; and
    (c) first and second unity gain buffers coupled in parallel at their inputs to the output node and at their outputs to the internal node, wherein the first buffer is configured to have a voltage tracking range approximately up to a positive supply rail and the second buffer is configured to have a voltage tracking range approximately down to a negative supply rail, wherein the voltage tracking ranges of said buffers overlap each other, to provide an overall substantially rail-to-rail voltage tracking range.

2. The integrated circuit of claim 1, further comprising a phase detector for receiving an input reference signal and a feedback signal from the oscillator and for generating the fast and slow signals in response to said input reference and feedback signals.

3. The integrated circuit of claim 1, wherein said first current source is selectively coupleable between the positive supply rail and the internal node or the output node, and said second current source is selectively coupleable between the internal node or the output node and the negative supply rail.

4. The integrated circuit of claim 3, wherein the switching network comprises a first switch for coupling the first current source to the internal node in response to the fast signal, a second switch for coupling the first current source to the output node in response to a complement of the fast signal, a third switch for coupling the second current source to the internal node in response to a complement of the slow signal, and a fourth switch for coupling the second current source to the output node in response to the slow signal.

5. The integrate circuit of claim 1, wherein each of said first and second buffers comprises two cascaded source-follower transistors.

6. The integrated circuit of claim 5, wherein said first buffer comprises an input NMOS source-follower transistor coupled at an input to the output node and cascaded with a PMOS source-follower transistor coupled at an output to the internal node, and said second buffer comprises an input PMOS source-follower transistor coupled at an input to the output node and cascaded with an NMOS source-follower transistor coupled at an output to the internal node.

7. The integrated circuit of claim 6, said first buffer farther comprising a pair of current sources for providing biasing currents to said input and output source-follower transistors, said second buffer further comprising a pair of current sources for providing biasing currents to said input and output source-follower transistors.

8. The integrated circuit of claim 1, wherein each of said first and second buffers comprises a differential transistor pair.

9. The integrated circuit of claim 8, wherein said first buffer comprises a differential pair of NMOS input transistors and said second buffer comprises a differential pair of PMOS input transistors.

10. In a charge pump circuit of an integrated circuit, the charge pump circuit comprising first and second current sources, a method for providing an output control voltage to adjust an oscillator frequency in response to fast and slow signals, the method comprising the steps of:
    (a) receiving said fast and slow signals;
    (b) selectively coupling with a switching network, in response to said fast signal, the first current source to one of an internal node and an output node coupled to an output capacitor and having an output voltage, and, in response to said slow signal, the second current source to one of the internal node and the output node; and
    (c) tracking at the internal node, with first and second unity gain buffers coupled in parallel at their inputs to the output node and at their outputs to the internal node, the voltage at the output node with an overall substantially rail-to-rail voltage tracking range, comprising the steps of providing, with the first buffer, a voltage tracking range approximately up to a positive supply rail and providing, with the second buffer, a voltage tracking range approximately down to a negative supply rail, wherein the voltage tracking ranges of said buffers overlap each other.

11. The method of claim 10, further comprising the step of receiving, with a phase detector, an input reference signal and a feedback signal from the oscillator and generating the fast and slow signals in response to said input reference and feedback signals.

12. The method of claim 10, wherein said first current source is selectively coupleable between the positive supply rail and the internal node or the output node, and said second current source is selectively coupleable between the internal node or the output node and the negative supply rail.

13. The method of claim 12, wherein the switching network comprises a first switch for coupling the first current source to the internal node in response to the fast signal, a second switch for coupling the first current source to the output node in response to a complement of the fast signal, a third switch for coupling the second current source to the internal node in response to a complement of the slow signal, and a fourth switch for coupling the second current source to the output node in response to the slow signal.

14. The method of claim 10, wherein each of said first and second buffers comprises two cascaded source-follower transistors.

15. The method of claim 14, wherein said first buffer comprises an input NMOS source-follower transistor coupled at an input to the output node and cascaded with a PMOS source-follower transistor coupled at an output to the internal node, and said second buffer comprises an input PMOS source-follower transistor coupled at an input to the output node and cascaded with an NMOS source-follower transistor coupled at an output to the internal node.

16. The method of claim 15, further comprising the step of providing biasing currents to said input and output source-follower transistors of said first buffer and providing biasing currents to said input and output source-follower transistors of said second buffer.

17. The method of claim 10, wherein each of said first and second buffers comprises a differential transistor pair.

18. The method of claim 17, wherein said first buffer comprises a differential pair of NMOS input transistors and said second buffer comprises a differential pair of PMOS input transistors.

* * * * *